United States Patent
Ogawa et al.

(10) Patent No.: US 6,756,420 B2
(45) Date of Patent: Jun. 29, 2004

(54) COATING COMPOSITION AND A PROCESS TO FORM A COATING FILM WITH USE THEREOF

(75) Inventors: Tetsuo Ogawa, Hiratsuka (JP); Hisashi Isaka, Atsugi (JP)

(73) Assignee: Kansai Paint Co., Ltd., Hyogo-ken (JP)

( * ) Notice: Subject to any disclaimer, the term of this patent is extended or adjusted under 35 U.S.C. 154(b) by 97 days.

(21) Appl. No.: 10/266,593

(22) Filed: Oct. 9, 2002

(65) Prior Publication Data

US 2003/0119980 A1 Jun. 26, 2003

(30) Foreign Application Priority Data

Oct. 10, 2001 (JP) ........................................ 2001-312064

(51) Int. Cl.$^7$ .............................. C08F 2/50; C07C 69/66
(52) U.S. Cl. ...................... 522/170; 522/104; 522/107; 522/149; 522/150; 522/153; 522/154; 522/167; 522/108; 522/168; 528/297; 427/487; 427/508; 427/512; 427/202; 427/214
(58) Field of Search ................................ 522/104, 107, 522/108, 149, 150, 153, 154, 167, 168, 170; 528/297; 427/487, 508, 512, 202, 214

(56) References Cited

U.S. PATENT DOCUMENTS

| | | | | | |
|---|---|---|---|---|---|
| 5,852,136 | A | * | 12/1998 | Green | 525/456 |
| 5,952,452 | A | * | 9/1999 | Aerts et al. | 528/297 |
| 6,069,203 | A | * | 5/2000 | Henry et al. | 525/131 |
| 6,649,786 | B2 | * | 11/2003 | Isaka | 560/186 |

* cited by examiner

*Primary Examiner*—James J. Seidleck
*Assistant Examiner*—Sanza L. McClendon
(74) *Attorney, Agent, or Firm*—Wenderoth, Lind & Ponack, LLP

(57) ABSTRACT

This invention provides a high-solids coating composition which comprises (A) a compound which has at least one radically polymerizable unsaturated group per molecule, (B) a hydroxyl group-containing ester compound which is obtained by ester-forming addition reaction between 2,2-dimethylolalkanoic acid having 6 to 8 carbon atoms and alkanoic acid monoglycidylester, and which has an acid value of 20 mgKOH/g or less, (C) a curing agent which is reactive with the above-mentioned hydroxyl group-containing ester compound (B), and (D) a photopolymerization initiator, and also provides a process to form a coating film by spray coating of said coating composition, which process is characterized by irradiating flying paint particles which have been sprayed and/or paint which has been applied onto a substrate with active energy ray so as to make the coating composition partially react, and by subsequently heating the coating composition.

19 Claims, No Drawings

COATING COMPOSITION AND A PROCESS TO FORM A COATING FILM WITH USE THEREOF

BACKGROUND OF THE INVENTION

1. Field of the Invention

This invention relates to a high-solids coating composition which is cured by light irradiation and heat, and which is capable of inhibiting the sag of paint without affecting performances of coating film, and also to a process to form a cured coating film with use of said coating composition.

2. Description of Prior Arts

The reduction of the amount of organic solvent used has been one of important objectives in the field of coating composition, from the viewpoint of environmental protection against air pollution and the saving of resources. As a means to achieve this objective, there has been developed so-called "high-solids coating composition", i.e., an organic solvent type paint wherein the amount of organic solvent contained in paint is reduced by which to increase solid content.

Simple reduction of the amount of organic solvent contained in an organic solvent type paint causes increase of paint viscosity. If a high-viscous paint which contains a small amount of organic solvent is used for spray coating which is usually employed in such a field as automobile coating, insufficiently atomized paint is applied onto a substrate, and, thus, resultant coating film decreases in smoothness. It is therefore necessary to lower the viscosity of a high-solids coating composition to such an extent as to be suitable for spray coating. For this purpose, there have been proposed an idea of lowering the molecular weight of resin components in paint and an idea of decreasing the polarity of resin.

Thus proposed coating compositions are atomizable in spray coating. However, only a small amount of solvent is volatilized during the time from when the coating composition is thrown from spray nozzle up to the time when it is applied onto substrate. On this account, the increase of viscosity of the applied paint is small, and, thus, the viscosity of applied paint is lower than conventional organic solvent type paint, with the result that the applied paint is liable to sag. In particular, when substrate is placed in a heat-drying oven in a baking step, the temperature of applied paint increases and causes the decrease of viscosity, resulting in sagging, before thermosetting reaction occurs.

With a view to preventing the sag of paint, it has been known to add a fluidity controlling agent to paint. In this case, however, fluidity controlling agent usually needs to be blended in larger amount than in conventional organic solvent type paint, in order that fluidity controlling agent may produce enough effects in the above-mentioned high-solids coating composition. The blending of a large amount of fluidity controlling agent has, however, caused problems that the appearance of finished coating film such as gloss is marred, that a coating film composed of two or more coats superposed decreases in inter-layer adhesivity, or that the water resistance of a coating film lowers. When, on the other hand, resin to be contained in a coating composition is rendered low-molecular or low-polar by which to attain high solids content, there are caused grave defects that coating film performances such as coating film hardness, acid rain resistance and scuff resistance are spoiled.

Japanese Patent Application Laid-Open (Kokai) No. 70471/95 discloses a method of applying, by spray-coating, a high-solids paint which comprises a macromonomer having ethylenically double bond at one end and a photopolymerization initiator, wherein sag is prevented by irradiating flying paint particles with ultraviolet ray. In this method, the increase of viscosity is achieved by the radical polymerization of macromonomer, and no three-dimensional crosslinkage occurs, and, therefore, smooth coating film can be obtained. However, macromonomer needs to be used in such a large amount as usually 30% by weight or more on the basis of solid content of paint, for the purpose of the prevention of sag. This has caused problems that the solid content of paint cannot be increased, or that coating film performances such as weatherability are liable to be spoiled.

International PCT Publication WO 97/20642 discloses a method of a coating film formation which comprises, in spray-coating of a paint which contains epoxy group-containing resin and photocationically polymerization initiator, irradiating the paint thrown from spray gun with active energy ray and then heat-curing thus applied coating film. In this method, however, there have been problems that the amount of basic components to be blended needs to be regulated to such an extent as not to inhibit cation polymerization, that a coating film which is finally obtained after baking has sometimes poor performances, or that cationic polymerization initiator causes a coating film to yellow.

The objective of this invention is to provide a coating composition which is free from the above-mentioned defects of conventional techniques, and which has low viscosity in spite of high solids content, which causes no sagging of coating film in coating steps and gives good appearance of finished coating film, and which is capable of forming a cured coating film excellent in coating film performances such as coating film hardness, acid rain resistance and scuff resistance.

Another objective of this invention is to provide a method of forming, with use of the above-mentioned coating composition, a cured coating film which is excellent in coating film performances such as coating film hardness, acid rain resistance and scuff resistance, said method causing no sagging in coating steps and gives good appearance of finished coating film.

Other objectives and characteristic features of this invention will be clearly seen in the following.

SUMMARY OF THE INVENTION

Assiduously studying with a view to achieving the above-mentioned objectives, inventors of this invention have developed a new coating composition which comprises radically polymerizable initiator, specific hydroxyl group-containing compound, curing agent and photopolymerization initiator, and found out that, by means of irradiating said coating composition with light, either during spray coating or immediately after applied, there can be formed a cured coating film which satisfies the above-mentioned requirements, and, thus, have completed this invention.

This invention provides a high-solids coating composition which comprises:

(A) a compound which has at least one radically polymerizable unsaturated group per molecule, (B) a hydroxyl group-containing ester compound which is obtained by ester-forming addition reaction between 2,2-dimethylolalkanoic acid of the following formula (I):

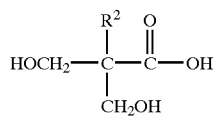

wherein $R^2$ is an alkyl group having 2 to 4 carbon atoms, and alkanoic acid monoglycidylester of the following formula (II):

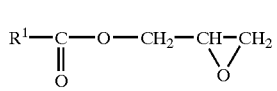

wherein $R^1$ is an alkyl group having 4 to 20 carbon atoms, and which has an acid value of 20 mgKOH/g or less, (C) a curing agent which is reactive with the above-mentioned hydroxyl group-containing ester compound (B), and (D) a photopolymerization initiator.

This invention also provides a method for forming a cured coating film by spray-coating of the above-mentioned coating composition, which method is characterized in that flying paint particles which have been sprayed and/or paint which has been applied onto substrate are irradiated with active energy ray by which to cause partial reaction of the coating composition, and subsequently heating thus applied coating film.

This invention further provides a method of forming a multi-layered coating film which comprises at least one layer of colored coating film and at least one layer of clear coating film, the uppermost layer being a clear coating film, which method is characterized in that the uppermost clear coating film is formed by the above-mentioned method for forming a cured coating film.

In the following, the coating composition of this invention and a method for forming a cured coating film with use of the coating composition are explained in more detail.

DESCRIPTION OF SPECIFIC EMBODIMENTS

The coating composition of this invention comprises, as basic components, (A) a compound which has at least one radically polymerizable unsaturated group per molecule, (B) a hydroxyl group-containing ester compound, (C) a curing agent and (D) a photopolymerization initiator.

(A) Compound Which has at Least One Radically Polymerizable Unsaturated Group Per Molecule In the composition of this invention, (A) a compound which has at least one radically polymerizable unsaturated group per molecule (hereinafter sometimes abbreviated as "(A) polymerizable compound") is a low-molecular or high-molecular compound which can be radically polymerized by irradiated with active energy ray in paint. Examples of this compound (A) include polymerizable unsaturated group-containing resin and polymerizable unsaturated group-containing monomer each having at least one radically polymerizable unsaturated group per molecule.

Examples of the above-mentioned polymerizable unsaturated group-containing resin include unsaturated group-containing polyester resin, unsaturated group-containing polyurethane resin, unsaturated group-containing epoxy resin, unsaturated group-containing phosphoric acid-modified epoxy resin, unsaturated group-containing acrylic resin, unsaturated group-containing silicone resin and unsaturated group-containing melamine resin.

As examples of polymerizable unsaturated group-containing monomer, there can be mentioned monofunctional polymerizable monomer, bifunctional polymerizable monomer and tri- or more-functional polymerizable monomer as follows:

Examples of monofunctional polymerizable monomer include vinyl aromatic compound such as styrene and α-methyl styrene; (meth)acrylates such as methyl (meth)acrylate, ethyl (meth)acrylate, butyl (meth)acrylate, 2-ethylhexyl (meth)acrylate, lauryl (meth)acrylate, cyclohexyl (meth)acrylate, cyclohexenyl (meth)acrylate, 2-hydroxyethyl (meth)acrylate, hydroxypropyl (meth)acrylate, tetrahydrofurfuryl (meth)acrylate, ε-caprolactone-modified tetrahydrofurfuryl (meth)acrylate, phenoxyethyl (meth)acrylate, phenoxypolyethyleneglycol (meth)acrylate, dicyclopentenyl (meth)acrylate, dicyclopentenyl oxyethyl (meth)acrylate, isobornyl (meth)acrylate, benzyl (meth)acrylate, adduct of hydroxyethyl (meth)acrylate with ε-caprolactone, polyethyleneglycol mono(meth)acrylate, polypropyleneglycol mono(meth)acrylate, 2-hydroxy-3-phenoxypropyl (meth)acrylate, 2-hydroxy-3-butoxypropyl (meth)acrylate, phthalic acid monohydroxyethyl (meth) acrylate and dimethylaminoethyl (meth)acrylate; Aronix M110 (paracumylphenol-ethyleneoxide-modified acrylate manufactured by Toagosei Chemical Industry Co., Ltd.); (meth)acrylamides such as N-methylol (meth)acrylamide, N-methylol (meth)acrylamide butyl ether and acryloylmorpholine; and N-vinyl-2-pyrrolidone.

Examples of bifunctional polymerizable monomer include ethyleneglycol di(meth)acrylate, diethyleneglycol di(meth)acrylate, polyethyleneglycol di(meth)acrylate, propyleneglycol di(meth)acrylate, dipropyleneglycol di(meth) acrylate, polypropyleneglycol di(meth)acrylate, neopentylglycol di(meth)acrylate, 1,4-butanediol di(meth)acrylate, 1,6-hexanediol di(meth)acrylate, bisphenol A ethyleneoxide-modified di(meth)acrylate, bisphenol A propyleneoxide-modified di(meth)acrylate, 2-hydroxy-1-acryloxy-3-methacryloxypropane, tricyclodecanedimethanol di(meth) acrylate and di(meth)acryloyloxyethyl acid phosphate; KAYARAD HX-220, KAYARAD HX-620, KAYARAD R-604 and MANDA (all of the latter four are bifunctional polymerizable unsaturated monomers manufactured by Nippon Kayaku K.K.).

Examples of tri- or more-functional polymerizable monomer include trimethylolpropane tri(meth)acrylate, trimethylolpropane ethyleneoxide-modified tri(meth)acrylate, trimethylolpropane propyleneoxide-modified tri(meth)acrylate, glycerin tri(meth)acrylate, glycerin ethyleneoxide-modified tri(meth)acrylate, glycerin propyleneoxide-modified tri (meth)acrylate, pentaerythritol tri(meth)acrylate, pentaerythritol tetra(meth)acrylate, isocyanuric ethyleneoxide-modified triacrylate and dipentaerythritol hexa(meth) acrylate.

As examples of polymerizable compound (A) which is curable by radical polymerization, the above-mentioned polymerizable unsaturated group-containing resin and polymerizable unsaturated group-containing monomer are usable either separately or each in combination with two or more species.

Especially preferable among the above-mentioned examples of polymerizable compound (A) are monomer type ones, in particular, adduct of hydroxyethyl (meth) acrylate with ε-caprolactone, acryloylmorpholine, paracumylphenol ethyleneoxide-modified acrylate (trademark: Aronix M110), bisphenol A ethyleneoxide-modified di(meth)acrylate, bisphenol A propyleneoxide-modified di(meth)acrylate, trimethylolpropane tri(meth)acrylate and pentaerythritol tetra(meth)acrylate.

In this specification, "(meth)acrylate" means "acrylate or methacrylate".

(B) Hydroxyl Group-containing Ester Compound

In the composition of this invention, hydroxyl group-containing ester compound (B) is a product of ester-forming addition reaction between 2,2-dimethylolalkanoic acid of the following formula (I):

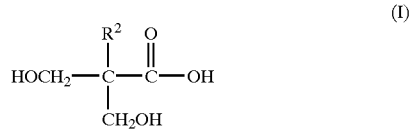

wherein $R^2$ is an alkyl group having 2 to 4 carbon atoms, and alkanoic acid monoglycidylester of the following formula (II):

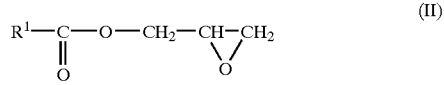

wherein $R^1$ is an alkyl group having 4 to 20, preferably 4 to 13, carbon atoms,
and which has an acid value of 20 mgKOH/g or less.

As examples of 2,2-dimethylolalkanoic acid of formula (I), there can be mentioned 2,2-dimethylolbutanoic acid, 2,2-dimethylolpentanoic acid and 2,2-dimethylolhexanoic acid, among which 2,2-dimethylolbutanoic acid is preferable.

In the above-mentioned formula (II), when the number of carbon atoms of the alkyl group $R^1$ is less than 4, the polarity of thus obtained hydroxyl group-containing ester-forming addition reaction product becomes high, and compatibility with curing agent or the like gets liable to decrease. When, on the other hand, the number of said carbon atoms is more than 20, the hardness of a cured matter which is formed with use of thus obtained hydroxyl group-containing ester-forming addition reaction product gets liable to decrease. Alkyl group $R^1$ in this alkanoic acid monoglycidylester is desirably branched rather than straight-chain. The ester-forming addition reaction product which is derived from alkanoic acid monoglycidylester of the above-mentioned formula (II) wherein $R^1$ is a branched alkyl group is superior in compatibility with curing agent or the like, and gives cured matter having much higher hardness.

Examples of alkanoic acid monoglycidylester of the above-mentioned formula (II) include pivalic acid glycidylester, hexanoic acid glycidylester, cyclohexane carboxylic acid glycidylester, 2-ethylhexanoic acid glycidylester, isononanoic acid glycidylester, decanoic acid glycidylester, undecanoic acid glycidylester, lauric acid glycidylester, myristic acid glycidylester, palmitic acid glycidylester, stearic acid glycidylester, "Cardura E10" (trademark of neodecanoic acid monoglycidylester manufactured by Japan Epoxy Resin Co., Ltd.), "Glydexx N10" (trademark of compound which is mainly composed of neodecanoic acid monoglycidylester, manufactured by Exxon Mobil Corporation) and "Araldite PT910" (trademark of compound which is mainly composed of neodecanoic acid monoglycidylester, manufactured by Ciba-Geigy). These compounds may be used either singly or in combination of two or more species. Among the above-mentioned compounds, pivalic acid glycidylester, cyclohex-anoic acid glycidylester, 2-ethylhexanoic acid glycidylester, isononanoic acid glycidylester, decanoic acid glycidylester, "Cardura E10", "Glydexx N10" and "Araldite PT910" are in particular desirable from the viewpoint of balance between compatibility with curing agent or the like and the hardness of cured matter which is formed from thus obtained hydroxyl group-containing ester-forming addition reaction product.

The hydroxyl group-containing ester compound (B) is a product of ester-forming addition reaction between 2,2-dimethylolalkanoic acid of the above-mentioned formula (I) and alkanoic acid monoglycidylester of formula (II), and has an acid value of 20 mgKOH/g or less, preferably 10 mgKOH/g or less, and usually has a hydroxyl value in a range of 300 to 550 mgKOH/g, preferably in a range of 350 to 530 mgKOH/g, and contains, as main ingredients, compounds of the following formula (III) and/or (IV):

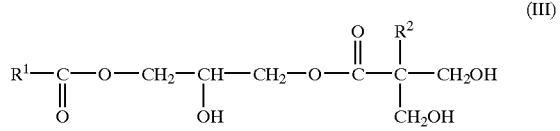

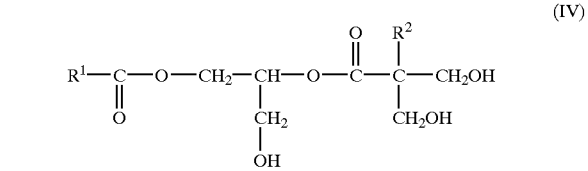

wherein $R^1$ and $R^2$ are as defined in the above.

It is preferable that the hydroxyl group-containing ester compound (B) contains unreacted 2,2-dimethylolalkanoic acid and unreacted alkanoic acid monoglycidylester as little as possible, and contains subsidiary reaction products in the possible smallest amount. The hydroxyl group-containing ester compound (B) preferably contains therein at least 80% by weight, in particular at least 90% by weight, of the compounds of the above-mentioned formula (III) or (IV).

The hydroxyl group-containing ester compound (B) can be produced by the following method.

In detail, 2,2-dimethylolalkanoic acid of the above formula (I) is melted or dissolved in a sovent, and the resultant melted matter or solution is mixed with alkanoic acid monoglycidylester of the above formula (II), and is thus subjected to ester-forming addition reaction until the acid value of reaction product becomes 20 mgKOH/g or less, and, thus, a hydroxyl group-containing ester-forming addition reaction product is produced.

When 2,2-dimethylolalkanoic acid of the above formula (I) and alkanoic acid monoglycidylester of the above formula (II) are subjected to ester-forming addition reaction, reaction temperature is preferably in a range of about 110 to about 140° C. from the standpoint of meltability of 2,2-dimethylolalkanoic acid, reaction rate of ester-forming addition reaction, improbableness of subsidiary reaction such as a reaction between hydroxyl group and carboxyl group and difficulty in coloring of reaction product. Although the addition of basic catalyst such as amine can accelerate ester-forming addition reaction, thus produced reaction product is liable to be colored. Reaction is, therefore, preferably conducted without catalyst with a view to obtaining a non-colored or scarcely-colored reaction product.

2,2-Dimethylolalkanoic acid of the formula (I) can be either heated and melted singly or dissolved in a solvent. In the latter case, usable solvent is not restricted in particular.

It is preferable, however, that solvent does not react either with reaction product or with starting material. Especially desirable are ester-type and ketone-type solvents which are sufficiently capable of dissolving the above-mentioned 2,2-dimethylolalkanoic acid. When a solvent is used for a reaction in the production method, a part or whole of the solvent may be removed after reaction is over. In this case, it is preferable to use a solvent which can easily be removed. Butyl acetate, isobutyl acetate and methylisobutylketone are in particular suitable in this regard. In the production method, it is also acceptable to dissolve 2,2-dimethylolalkanoic acid either in an organic solvent-solution of resin such as acrylic resin and polyester resin which are usable as resin component of paint etc., or in said resin which contains no organic solvent, and to allow thus dissolved 2,2-dimethylolalkanoic acid to react with the above-mentioned alkanoic acid monoglycidylester.

In the ester-forming addition reaction, 2,2-dimethylolalkanoic acid of formula (I) and alkanoic acid monoglycidylester of formula (II) are made to react in such a proportion that the amount of epoxy group in alkanoic acid monoglycidylester of formula (II) is usually 0.8 to 1.5 equivalents, preferably 0.9 to 1.2 equivalents, much desirably 0.95 to 1.1 equivalents, per equivalent of carboxyl group in 2,2-dimethylolalkanoic acid of formula (I), in order that the residue of unreacted matters may remain as little as possible. When 2,2-dimethylolalkanoic acid remains as unreacted matter, it is liable to deposit in reaction product. When, on the other hand, alkanoic acid monoglycidylester remains unreacted, it undesirably acts as a volatile content or a plasticizer.

Furthermore, in the production method, the ester-forming addition reaction between 2,2-dimethylolalkanoic acid of the above-mentioned formula (I) and alkanoic acid monoglycidylester of formula (II) is preferably conducted until the reaction product has an acid value of 20 mgKOH/g or less, preferably 10 mgKOH/g or less, with a view to inhibiting the deposition of unreacted 2,2-dimethylolalkanoic acid.

The hydroxyl group-containing ester-forming addition reaction product which is produced by the above method contains, as main ingredients, compounds of the aforementioned formula (III) and/or (IV). Said product usually contains both of compounds of formula (III) and (IV). The proportion of these two compounds is considered to change according to reaction condition.

The compounds of formulae (III) and (IV) can easily be isolated from the reaction product and purified by any normal method, e.g., a suitable combination of extraction, chromatography, etc.

The afore-mentioned hydroxyl group-containing ester-forming addition reaction product has preferably a hydroxyl value in a range of 300 to 550 mgKOH/g, desirably in a range of 350 to 530 mgKOH/g, for the sake of curability when the product is combined with a curing agent into a curable coating composition, and for the sake of compatibility with curing agent etc.

The main ingredients of the hydroxyl group-containing ester-forming addition reaction product contain, on the one hand, three highly reactive hydroxyl groups and, on the other, have a hydrophobic group with good balance, and, therefore, the product of this invention shows, as a remarkable effect, both curability and compatibility with curing agent.

Triol compounds of the above-mentioned formula (III) or (IV) which are main ingredients of the ester-forming addition reaction product have low molecular weight, and accordingly have low viscosity, and, furthermore, have high hydroxyl value. Hence, when these triol compounds are to be combined with, for instance, generally low-viscous polyisocyanate curing agent for the purpose of the production of a curable coating composition, it follows that low-viscous polyisocyanate curing agent is necessarily blended in a larger amount with a view to harmonizing the functional equivalent between hydroxyl group and isocyanate group, than in the case where conventional resin having low hydroxyl value is used, with the result that much lower-viscous curable composition can be produced, which is very advantageous for the sake of manufacture of low-solvent articles.

(C) Curing Agent

The curing agent which is used in the composition of this invention is reactive with hydroxyl group-containing ester compound (B). Any curing agent is usable without particular restriction insofar as it has functional group which is reactive with hydroxyl group. Examples of such a curing agent (C) include polyisocyanate compound, amino resin, acid anhydride group-containing resin, epoxy group-containing resin and alkoxysilyl group-containing resin, among which polyisocyanate compound and amino resin are suitable.

The above-mentioned polyisocyanate compound include both those whose isocyanate group (NCO group) is not blocked (which may hereinafter be abbreviated as "non-blocked polyisocyanate compound") and those whose isocyanate group is blocked (which may hereinafter be abbreviated as "blocked polyisocyanate compound").

Examples of non-blocked polyisocyanate compound include organic polyisocyanate per se, e.g., aliphatic diisocyanates such as lysine diisocyanate, hexamethylene diisocyanate, trimethylhexane diisocyanate and dimer acid diisocyanate; alicyclic diisocyanates such as hydrogenated xylylene diisocyanate, isophorone diisocyanate, methylcyclohexane-2,4 (or 2,6)-diisocyanate, cyclohexylene diisocyanate, 4,4'-methylenebis(cyclohexylisocyanate) and 1,3-(isocyanatomethyl)cyclohexane; aromatic diisocyanates such as phenylene diisocyanate, tolylene diisocyanate, xylylene diisocyanate, diphenylmethane diisocyanate, tetramethylxylylene diisocyanate and naphthalene diisocyanate; and organic polyisocyanate compounds of tri- or higher-valence such as lysine triisocyanate, 2-isocyanatoethyl-2,6-diisocyanatocaproate, 3-isocyanatomethyl-1,6-hexamethylenediisocyanate and 4-isocyanatomethyl-1,8-octamethylenediisocyanate (so-called triaminonane triisocyanate); dimer or trimer of these polyisocyanate compounds which have at least two isocyanate groups per molecule; and prepolymer which is obtained by a urethane-forming reaction between said polyisocyanate compounds which have at least two isocyanate groups per molecule, and polyvalent alcohol, low molecular polyester resin, water, or the like, under a condition of excess isocyanate groups.

Blocked polyisocyanate compound has a structure that isocyanate group of the above-mentioned non-blocked polyisocyanate compound is blocked with blocking agent. Suitable examples of said blocking agent include lactam compound such as ε-caprolactam, δ-valerolactam, γ-butyrolactam and β-propiolactam; oxime type compound such as formamidoxime, acetaldoxime, acetoxime, methylethylketoxime, diacetylmonoxime, benzophenoxime and cyclohexanone oxime; phenolic type compound such as phenol, xylenol, para-t-butylphenol and cresol; aliphatic alcohols such as methanol, ethanol, n- or i-propanol, n-, i- or t-butanol and 2-ethylhexanol; aromatic alkyl alcohols such as benzylalcohol and methylbenzylalcohol; ether alcohol compound such as ethyleneglycolmonomethylether, ethyleneglycolmonoethylether, ethyleneglycolmonopropylether ethyleneglycolmonobutylether, diethyleneglycolmonomethylether, diethyleneglycolmonoethylether and propyleneglycolmonomethylether; and active methylene type compound such as dimethyl malonate, diethyl malonate, ethyl acetoacetate, methyl acetoacetate, ethyl acetoacetate and acetylacetone; and low-molecular polyamide such as n-methylacetamide, n-ethylacetamide, n-methylpropionamide and n-methylformamide.

Examples of amino resin which is usable as curing agent include methylol amino resin which is obtained by a reaction between amino component such as melamine, urea, benzoguanamine, acetoguanamine, steroguanamine, spiroguanamine and dicyandiamide, and aldehyde. Examples of said aldehyde include formaldehyde, paraformaldehyde, acetaldehyde and benzaldehyde. Said amino resin also includes methylol melamine resin which has been etherified with one or more species of alcohol. Examples of alcohol which is used for etherification include monohydric alcohol such as methyl alcohol, ethyl alcohol, n-propyl alcohol, isopropyl alcohol, n-butyl alcohol, isobutyl alcohol, 2-ethyl butanol and 2-ethylhexanol. In particular suitable is melamine resin which is prepared by etherifying at least a part of methylol groups of methylol melamine resin with $C_1$ to $C_4$ monohydric alcohol.

Examples of the above-mentioned melamine resin include methyletherified melamine resin such as Cymel 300, Cymel 303, Cymel 325, Cymel 327, Cymel 350, Cymel 730, Cymel 736 and Cymel 738 (all of which are manufactured by Mitsui Cytec Co., Ltd.), Melan 522 and Melan 523 (both of which are manufactured by Hitachi Chemical Co., Ltd.), Nikalac MS001, Nikalac MX 430 and Nikalac MX650 (all of which are manufactured by Sanwa Chemical Co., Ltd.), Sumimal M-55, Sumimal M-100 and Sumimal M-40S (all of which are manufactured by Sumitomo Chemical Company Limited) and Resimin 740 and Resimin 747 (both of which are manufactured by Monsanto Co.); butyletherified melamine resin such as U-van 20SE and U-van 225 (both of which are manufactured by Mitsui Chemicals, Inc.) and Superbeckamin J820-60, Superbeckamin L-117-60, Superbeckamin L-109-65, Superbeckamin 47-508-60, Superbeckamin L-118-60 and Superbeckamin G821-60 (all of which are manufactured by Dainippon Ink & Chemicals, Inc.); methylether/butylether-mixed etherified melamine resin such as Cymel 232, Cymel 266, Cymel XV-514 and Cymel 1130 (all of which are manufactured by Mitsui Cytec Co., Ltd.), Nikalac MX500, Nikalac MX600, Nikalac MS35 and Nikalac MS95 (all of which are manufactured by Sanwa Chemical Co., Ltd.), Resimin 753 and Resimin 755 (both of which are manufactured by Monsanto Co.) and Sumimal M-66B (which is manufactured by Sumitomo Chemical Company Limited.).

The above-mentioned polyisocyanate compounds and amino resins can each be used either separately or in combination with two or more species. Especially suitable as curing agent (C) are polyisocyanate compounds which have non-blocked isocyanate group. Photopolymerization initiator (D).

In the composition of this invention, photopolymerization initiator (D) generates radical when irradiated with active energy ray, and thus initiates the polymerization of the afore-mentioned polymerizable compound (A) in the composition of this invention. Any known ones may be used as this photopolymerization initiator.

Concrete examples of photopolymerization initiator include benzoin, benzoin methyl ether, benzoin ethyl ether, benzoin isobutyl ether, diethoxy acetophenone, 2-hydroxy-2-methyl-1-phenylpropan-1-one, benzylmethyl ketal, 1-hydroxycyclohexyl-phenylketone, 2-methyl-2-morpholino(4-thiomethyl-phenyl)propan-1-one, 2-benzyl-2-dimethylamino-1-(4-morpholinophenyl)butanone, 2,4,6-trimethylbenzoylphenylphosphine oxide, 2,4,6-trimethylbenzoylphenylethoxyphosphine oxide, benzophenone, methyl o-benzoylbenzoate, hydroxybenzophenone, 2-isopropylthioxanthone, 2,4-dimethylthioxanthone, 2,4-diethylthioxanthone, 2,4-dichlorothioxanthone, 2,4,6-tris(trichloromethyl)-S-triazine, 2-methyl-4,6-bis(trichloro)-S-triazine and 2-(4-methoxyphenyl)-4,6-bis(trichloromethyl)-S-triazine. These photopolymerization initiator may be used either separately or in combination of two or more species.

Coating Composition

The coating composition of this invention can be prepared by mixing the above-mentioned polymerizable compound (A), hydroxyl group-containing ester compound (B), curing agent (C) and photopolymerization initiator (D) with a suitable additive for paint.

In the coating composition of this invention, the blending proportion of polymerizable compound (A), hydroxyl group-containing ester compound (B), curing agent (C) and photopolymerization initiator (D) is not strictly limited, but may be varied according to the objective of use of coating composition. Generally, however, the proportion may be as follows.

The blending proportion of polymerizable compound (A) is preferably within a range of 1 to 200 parts by weight, especially 1.5 to 100 parts by weight, more desirably 2 to 50 parts by weight, per 100 parts by weight of the total of hydroxyl group-containing ester compound (B) and curing agent (C), from the viewpoint of both the appearance of finished coating film owing to sag-preventing effect caused by irradiation with active energy ray and the weatherability of coating film.

As for the blending proportion of hydroxyl group-containing ester compound (B) and curing agent (C), the weight ratio of solid content of hydroxyl group-containing ester compound (B)/curing agent (C) is preferably within a range of 90/10 to 50/50, especially 85/15 to 55/45, more desirably 80/20 to 60/40, from the viewpoint of curability, the hardness of thus obtained coating film and scuff resistance. In particular, when curing agent (C) is a polyisocyanate compound, equivalent ratio of NCO group in polyisocyanate compound/OH group in hydroxyl group-containing ester compound (B) is preferably within a range of 0.5/1 to 2.0/1, especially 0.7/1 to 1.5/1, from the viewpoint of curability, the hardness of thus obtained coating film, acid rain resistance and scuff resistance. The above-mentioned NCO group in polyisocyanate compound include blocked NCO group.

The blending proportion of photopolymerization initiator (D) is preferably within a range of 0.1 to 40 parts by weight, especially 0.3 to 30 parts by weight, more desirably 0.5 to 20 parts by weight, per 100 parts by weight of polymerizable compound (A), from the viewpoint of both the appearance of finished coating film owing to sag-preventing effect caused by irradiation with active energy ray and the weatherability of coating film.

The coating composition of this invention contains the above-mentioned (A) to (D) as essential components. If necessary, the coating composition of this invention may further contain any organic solvent known in the field of paint, other binder component, photosensitization accelerator, fluidity controlling agent, thermosetting catalyst, coloring pigment, metallic pigment, iridescent pigment, extender pigment, ultraviolet absorber, photostabilizer, anti-settling agent, coated surface regulator and other additives for paint.

As organic solvent to be blended in the composition of this invention, any may be used without particular restriction insofar as the solvent can dissolve or disperse the composition of this invention. Examples of such an organic solvent include hydrocarbon solvent such as heptane, toluene, xylene, octane and mineral spirit; ester solvent such as ethyl acetate, n-butyl acetate, isobutyl acetate, ethyleneglycol monomethylether acetate and diethyleneglycol monobutylether acetate; ketone solvent such as methylethylketone, methylisobutylketone diisobutylketone and cyclohexanone; alcohol solvent such as methanol, ethanol, isopropanol, n-butanol, sec-butanol and isobutanol; ether solvent such as n-butylether, dioxane, ethyleneglycol monomethylether and ethyleneglycol monoethylether; aromatic petroleum solvent such as Swasol 310, Swasol 1000 and Swasol 1500 (all of which are manufactured by Maruzen Petrochemical Co., Ltd.) and SHELLSOL A (manufactured by Shell Chemicals Co.). These organic solvent may be used either singly or in combination of two or more species.

The above-mentioned "other binder component" is to be blended with the composition of this invention for the purpose of improvement of coating film performance, improvement of viscous behavior of paint and cost reduction. Concrete examples of said other binder component include hydroxyl group-containing lactone-modified oligomer, hydroxyl group-containing resin and alkoxysilyl group-containing compound, among which hydroxyl group-containing resin is suitable. The proportion of said other binder component may be within a range of at most 100 parts by weight, preferably at most 50 parts by weight, per 100 parts by weight of the total of hydroxyl group-containing ester compound (B) and curing agent (C).

As the above-mentioned hydroxyl group-containing resin, any resin which has hydroxyl group may be used without particular restriction. Representative examples of usable hydroxyl group-containing resin include resins which have a hydroxyl value of 500 mgKOH/g or lower, preferably in a range of 20 to 300 mgKOH/g, and which have a number average molecular weight within a range of 500 to 50,000, preferably 1,000 to 30,000. As representative species of hydroxyl group-containing resin, there can be mentioned acrylic resin, polyester resin, silicone polyester resin, silicone acrylic resin, fluoroplastic and epoxy resin, among which acrylic resin and polyester resin are suitable.

The above-mentioned photosensitization accelerator is to be blended with the composition of this invention for the purpose of accelerating photopolymerization reaction caused by the above-mentioned photopolymerization initiator (D). Concrete examples of said photosensitization accelerator include tertiary amine type such as triethylamine, triethanolamine, methyldiethanolamine, 4-dimethylamino methylbenzoate, 4-dimethylamino ethylbenzoate, 4-dimethylamino isoamylbenzoate, 2-dimethylamino ethylbenzoate, Michler's ketone and 4,4-diethylaminobenzophenone; alkylphosphine type such as triphenylphosphine; and thioether type such as β-thiodiglycol. These photosensitization accelerator may be used either singly or in combination of two or more species. The photosensitization accelerator is preferably blended in an amount within a range of 0.1 to 20% by weight based on the amount of polymerizable compound (A).

As the above-mentioned fluidity controlling agent, there can be mentioned diurea-type fluidity controlling agent and organic polymer fine particles having a particle size of 50 to 500 nm which may be internally crosslinked.

The above-mentioned thermosetting catalyst is blended in the composition of this invention for the purpose of accelerating the curing reaction of the composition of this invention when it is heated. When the above-mentioned curing agent (C) is a blocked polyisocyanate compound, for instance, there is suitably used a curing catalyst which promotes the dissociation of blocking agent. Examples of preferable curing catalyst include organic metal catalyst such as tin octylate, dibutyltin di(2-ethylhexanoate), dioctyltin di(2-ethylhexanoate), dioctyltin diacetate, dibutyltin dilaurate, dibutyltin oxide, dioctyltin oxide and 2-ethyl hexanoate lead. When, on the other hand, curing agent (C) is an amino resin, there is suitably used, as a curing catalyst, phosphoric acid, sulfonic acid compound or amine-neutralized sulfonic acid compound. Representative examples of said sulfonic acid compound include p-toluene sulfonic acid, dodecylbenzene sulfonic acid, dinonylnaphthalene sulfonic acid and dinonylnaphthalene disulfonic acid. Amine in said amine-neutralized sulfonic acid compound may be any of primary, secondary or tertiary amine.

In the coating composition of this invention, when curing agent (C) is a non-blocked polyisocyanate compound, it comparatively easily reacts with hydroxyl group-containing ester compound (B), and, therefore, these two components are preferably separated from each other in advance, or, in other words, the coating composition of this invention is suitably used in two-pack system, in which case these two components are mixed with each other immediately before use. Components other than component (B) may be formulated either with the side of component (B) or with the side of component (C) in consideration of their reactivity.

The coating composition of this invention is a high-solids coating composition which is capable of reducing the amount of solvent in paint when applied, from the viewpoint of terrestrial environment protection. Solid content in the coating composition of this invention which have a viscosity of 60 seconds by Ford cup #4 at 20° C. account for at least 60% by weight, preferably at least 65% by weight, more desirably at least 70% by weight, especially at least 75% by weight.

The coating composition of this invention is so low-viscous as to be applicable by spray coating even when solid content at the time of application is 60% by weight or more. Thus this coating composition is excellent in atomization by spray coating, and is capable of forming a coating film which excels in smoothness, sharpness and fatness.

The coating composition of this invention is usable not only as a clear paint but also as a colored paint, a metallic paint and an iridescent paint into which coloring pigment, metallic pigment and iridescent pigment have respectively been formulated. This coating composition is capable of forming a cured coating film which excels in acid resistance, scuff resistance and appearance (e.g., gloss, fatness and sharpness). Hence, the coating composition of this invention is especially preferably usable as the uppermost clear paint in a multi-layer coating film which is composed of at least one colored paint and at least one clear paint which are applied in order.

Coating Film Forming Method

As stated above, the coating composition of this invention is so low-viscous as to be applicable by spray coating even when solid content is high at the time of application. This coating composition, on the other hand, contains, as a binder component, polymerizable compound (A) which is polymerized when irradiated with active energy ray, in addition to a combination of heat-curable hydroxyl group-containing ester compound (B) and curing agent (C). Hence, when flying paint particles which have been sprayed and/or paint immediately after applied are irradiated with active energy ray in spray coating of the coating composition of this invention, polymerizable compound (A) in paint is polymerized to increase the viscosity of paint, with the result that the sagging of coating film can be prevented.

This invention thus provides a process to form a cured coating film by spray coating of the above-mentioned coating composition of this invention, which process is characterized by irradiating flying paint particles which have been sprayed and/or paint which has been applied onto a substrate with active energy ray so as to make the coating composition partially react, and by subsequently heating the coating composition.

The coating composition of this invention may be applied at a room temperature. Under circumstances, e.g., in order to decrease paint viscosity by which to achieve the high solid content of paint when applied, the coating composition may be heated to about 30 to about 80° C., preferably about 40 to about 60° C., before applied.

As for heating method, anyone will do insofar as it does not give rise to the decrease of coatability caused by the increase of viscosity of paint or to the decrease of pot life of paint. For instance, in the case of a two-pack type paint [which is composed of pack on the side of component (B) and another pack on the side of component (C)] wherein curing agent (C) is a non-blocked polyisocyanate, when the composition of pack on the side of component (B) and the composition of pack on the side of component (C) are mixed and then heated, viscosity increases which is liable to cause the decrease of coatability or the remarkable reduction of pot life. The problems of increase of viscosity and of pot life can be evaded by heating at least one pack and homogeneously mixing compositions with a two-pack paint mixing apparatus (e.g., Precision Mix made by GRACO CO.). In detail, A-liquid tank of this apparatus is filled with the composition of pack on the side of component (B) and B-liquid tank of this apparatus is filled with the composition of pack on the side of component (C), and, then, A-liquid tank is heated to 55° C., while B-liquid tank is kept at room temperature. Then, with use of this two-pack paint mixing apparatus, thus heated composition of pack on the side of component (B) and the composition of pack on the side of component (C) which has been kept at room temperature are mixed with each other so that liquid temperature may become about 40° C. On the contrary, the composition of pack on the side of component (C) may be heated. Or, optionally, compositions of both packs are heated separately, and then mixed. Heating in the above-mentioned manner lowers the viscosity of the composition of this invention when applied, with the result that the coating composition of this invention as a high-solids paint further improves in coatability.

Examples of spray coating method for the coating composition of this invention include any known method such as air spray, rotary atomizing spray and airless spray. These spray coating methods may be conducted by applying electrostatic voltage.

According to the method of this invention, flying paint particles which have been sprayed and/or paint which has been applied onto a substrate are irradiated with active energy ray such as ultraviolet ray. This irradiation causes radical polymerization reaction of polymerizable compound (A) in paint, and, resultantly, the paint which has been applied onto a substrate increases in viscosity, and, thus, sag can be prevented. The irradiation of paint which has been applied onto a substrate can easily be conducted without any special apparatus, which is advantageous.

Active energy ray-irradiating conditions are not strictly restricted, but may be chosen appropriately depending on the species of applied coating composition or coating film thickness. The wave length of active energy ray to be irradiated is generally within a range of 200 to 450 nm. There may suitably be chosen any irradiation source that emits active energy ray having a wavelength of high sensitivity.

Examples of irradiation source include high-pressure mercury lamp, ultrahigh-pressure mercury lamp, xenon lamp, carbon arc, metal halide lamp and sun light. Irradiation conditions may be determined in accordance with viscosity-increasing effect on paint which is caused by irradiation. Usually, however, irradiation conditions are employed so that paint which has been applied on vertical wall may not sag. Suitable irradiation dose of ultraviolet ray is, concretely, 1 to 3000 mJ/cm$^2$, in particular 50 to 500 mJ/cm$^2$.

Paint on substrate which has been irradiated with active energy ray is then heat-cured. Heating conditions are not particularly restricted. When heating time is 5 minutes or longer, usually 5 to 60 minutes, heating temperature is suitably 60 to 180° C. When curing time is less than 5 minutes, suitable heating temperature is usually 60 to 300° C.

Paint which has been applied on substrate may be irradiated with active energy ray and heated simultaneously if sagging can be prevented.

The afore-mentioned method of this invention is capable of forming a cured coating film which excels in acid resistance, scuff resistance and appearance (e.g., gloss, fatness and sharpness).

Hence, the method of this invention is preferably usable for the formation of the uppermost clear coating film in the production of multi-layer coating film which is composed of at least one layer of colored coating film and at least one layer of clear coating film, and in which the uppermost layer is a clear coating film.

EXAMPLES

In the following, this invention is explained in more detail with Examples and Comparative Examples. Part and % are based on weight. The thickness of coating film means the thickness of cured film.

Synthesis Example 1

Synthesis of Hydroxyl Group-containing Ester Compound (B)

A reactor equipped with stirrer, cooler, temperature controller, nitrogen-introducing tube and dropping funnel was fed with 296 parts of 2,2-dimethylolbutanoic acid. The air in the reactor was replaced with nitrogen, and, then, said 2,2-dimethylolbutanoic acid was heated to 120° C. and melted. To thus melted matter, 490 parts of "Cardura E10" (trademark of Japan Epoxy Resin Co., Ltd., mainly composed of neodecanoic acid monoglycidyl ester) was added dropwise over a period of two hours, with the temperature maintained at 120° C. When acid value became 9 or lower, the reaction was terminated, and, thus, hydroxyl group-containing ester compound (B) was obtained. This hydroxyl group-containing ester compound (B) had a solid content of about 98%, a Gardner-Holdt viscosity (20° C.) of $Z_6Z_7$, a color number of 1, a hydroxyl value of 428 mgKOH/g, a number average molecular weight of 600 and a weight average molecular weight of 610.

Synthesis Example 2

Synthesis of Hydroxyl Group-containing Acrylic Resin

A reactor equipped with stirrer, cooler, temperature controller, nitrogen-introducing tube and dropping funnel was fed with 616 parts of ethyl-3-ethoxypropionate. The air in the reactor was replaced with nitrogen, and, then, said ethyl-3-ethoxypropionate was heated to 150° C. and was kept at this temperature. To thus heated matter, a mixture of 220 parts of styrene, 880 parts of isobutylmethacrylate, 242 parts of butylacrylate, 330 parts of 2-ethylhexylacrylate, 418 parts of 2-hydroxyethylmethacrylate, 88 parts of 2-hydroxyethylacrylate, 22 parts of acrylic acid and 220 parts of azobisisobutyronitrile was added dropwise over a period of five hours. After this dropwise addition was over, the resultant mixture was matured at 150° C. for 30 minutes, and, thus, there was obtained hydroxyl group-containing acrylic resin which had a solid content of 69% and a Gardner-Holdt viscosity (20° C.) of PQ. This acrylic resin (solid content) had a hydroxyl value of 100 mgKOH/g, an acid value of 7.2 mgKOH/g, a number average molecular weight of 2050 and a weight average molecular weight of 3070.

Synthesis Example 3

Synthesis of Lactone-modified Polyol

A reactor equipped with stirrer, cooler, temperature controller and nitrogen-introducing tube was fed with 400 parts of trimethylolpropane, 100 parts of 2-butyl-2-ethyl-1,3-propane diol, 520 parts of ε-caprolactone and 0.2 part of dibutyltin dilaurate. The air in the reactor was replaced with nitrogen, and, then, the resultant mixture was kept at 160° C. for eight hours with stirring, and, thus, there was obtained caprolactone-modified oligomer which had a solid content of 93%, a Gardner-Holdt viscosity (20° C.) of XY, a hydroxyl value of 560 mgKOH/g, a number average molecular weight of 550 and a weight average molecular weight of 650.

Examples 1 to 5 and Comparative Example 1

Preparation of Coating Composition

Components as shown in Table 1 which is mentioned later were homogeneously mixed at the compositional formulation as shown in Table 1, and, thus, organic solvent type high-solids paints (clear paints) were obtained. The compositional formulation as shown in Table 1 is indicated by the weight of solid content. "OH/NCO molar ratio" in Table 1 denotes equivalent ratio of hydroxyl group in components (A) and (B) to isocyanate group or blocked isocyanate group in component (C).

Notes in Table 1 mean the following.

| (Note 1) | "Desmodur N3300": Isocyanurate of hexamethylenediisocyanate manufactured by Sumika Bayer Urethane Co., Ltd., which has a content of isocyanate group of 22% by weight. |
|---|---|
| (Note 2) | "Blocked isocyanate compound": Blocked isocyanate compound which is prepared by equimolar-adding methylethylketoxime to isocyanate group of the above-mentioned Desmodur N3300. |
| (Note 3) | "Cymel 325": Imino-type melamine resin manufactured by Mitsui Cytec Co., Ltd. |
| (Note 4) | "LUCIRIN TPO": Acylphosphineoxide-type photoradically polymerizable initiator manufactured by BASF AG of Germany. |
| (Note 5) | "Scat 24": Trademark of organotin catalyst manufactured by Sankyo Organic Chemicals Co., Ltd. |
| (Note 6) | "Setalux C-7176VB-60": Trademark of rheology controlling agent which is a polyurea compound manufactured by Akzo Nobel N.V. |

Formation of Multi-layered Coating Film

A cold-rolled dull steel sheet which had passed through a chemical conversion treatment was coated with epoxy resin type cationically electrodepositable paint (to a film thickness of 25 μm), and was then heat-cured at 170° C. for 30 minutes, and, subsequently, was coated with intermediate paint ("LUGA-BAKE AM": trademark of polyester resin-.melamine resin-type paint of gray color manufactured by Kansai Paint Co., Ltd.) to a film thickness of 30 μm, and was then heat-cured at 140° C. for 30 minutes. The resultant surface of coating films was coated with the following metallic paint I to a film thickness of 18 μm, and was then left to stand still at room temperature for three minutes. The surface of the resultant uncured coating film was held vertical, and was coated with clear paints of Examples 1 to 5 and Comparative Example 1 whose viscosity had been adjusted to 60 seconds (Ford cup #4/20° C.), each to a film thickness of 45 μm. Immediately after coated, the coated sheet was held vertical, and was irradiated with ultraviolet ray from a high-pressure mercury lamp which was located at 15 cm from the coated sheet under a condition that the amount of energy was 300 mJ/cm$^2$. Subsequently, the coated sheet which was kept vertical was heated at 140° C. for 30 minutes so that both of the coating films might be cured simultaneously, and, thus, a multi-layered coating film-formed coated sheet was obtained. Incidentally, "Solids content at the application" in Table 1 means the concentration of solid content in clear paint immediately before applied whose viscosity had been adjusted to 60 seconds (Ford cup #4/20° C.) with use of ethyl-3-ethoxypropionate as a diluent.

Metallic Paint I

A metallic paint which is prepared by blending 140 parts of 50% acrylic resin solution A (Note 7), 50 parts of "U-van 28SE" (Note 8), 2 parts of "Alpaste 7640NS" (trademark of aluminum paste manufactured by Toyo Aluminium K.K." and 2.5 parts of "Carbonblack BP-1300" (trademark of carbon black manufactured by Cabot Corp. in USA), and diluting the resultant mixture with a mixed solvent composed of 35 parts of ethyl acetate, 35 parts of toluene, 10 parts of isobutanol and 20 parts of xylene, and further by adjusting viscosity to 14 seconds (Ford cup #4/20° C.).

| (Note 7) | 50% acrylic resin solution A: An acrylic resin solution which is prepared by the copolymerization of 15% of styrene, 15% of methylmethacrylate, 40% of butylmethacrylate, 13% of 2-ethylhexylacrylate, 15% of hydroxyethylmethacrylate and 2% of acrylic acid with use of azobisisobutyronitrile as a polymerization initiator in xylol, and which has a residual content after heating of 50%, an acid value of solution of 80 and solution viscosity of Y (Gardner-Holdt viscosity, 25° C.). |
|---|---|

-continued (Note 8) "U-van 28SE": Trademark of melamine formaldehyde resin solution manufactured by Mitsui Chemicals, Inc., whose solids content is 60% by weight.

Coating Film Performance Test

The above-mentioned multi-layered coating film-formed coated sheet was evaluated with respect to sag, appearance (sagging resistance), hardness, scuff resistance and acid resistance in a room at 20° C. in the following manner. Results of performance test are shown in Table 1 which is mentioned later.

Appearance (Sagging Resistance):

The appearance of surface of multi-layered coating film of coated sheet was visually evaluated.
○: No sag was observed.
X: Sag was observed.

Hardness:

Tukon hardness of surface of multi-layered coating film of coated sheet is indicated.

Scuff Resistance:

Polishing powder (Daruma Cleanser) was kneaded with water into paste, which was put on surface of multi-layered coating film of coated sheet. Said paste was then pressed with terminal of tester, which was reciprocated 25 times with a load of 0.5 kg applied thereon. Then, the surface was visually evaluated.
○: No change was seen in the gloss of coating film surface.
Δ: Gloss was lost a little.
X: Gloss was remarkably lost.

Acid Resistance:

A 0.5 cc drop of artificial rain of the following composition was placed on coating film of test sheet, which was then heated on a hot plate, which in turn had been heated to 80° C., for 30 minutes. The coating film was subsequently washed with water, and, then, the surface of coating film was visually observed, and was evaluated in accordance with the following criteria.

○: No change was seen in coating film surface.
Δ: Although neither whitening nor blister was seen, unevenness was observed around boundaries on coating film surface.
X: Whitening and/or blister was seen on coating film surface.

The artificial rain used was a mixture of 19.6 g of 1 mg/g aqueous solution of $NaNO_3$, 5.2 g of 1 mg/g aqueous solution of $KNO_3$, 3.7 g of 1 mg/g aqueous solution of $CaCl_2.2H_2O$, 8.2 g of 1 mg/g aqueous solution of $MgSO_4.7H_2O$, 73.3 g of 1 mg/g aqueous solution of $(NH_4)_2SO_4$, 30.0 g of 0.1 N aqueous solution of $H_2SO_4$, 20.0 g of 0.1 N aqueous solution of $HNO_3$, 10.0 g of 0.05 N aqueous solution of HCl and 4.7 g of 1 mg/g aqueous solution of NaF, whose pH had been adjusted to 1.0 with $H_2SO_4$.

TABLE 1

| | Component | Ex 1 | Ex 2 | Ex 3 | Ex 4 | Ex 5 | Comp Ex 1 |
|---|---|---|---|---|---|---|---|
| A | Trimethylolpropane triacrylate | 20 | | 20 | 20 | 20 | |
| | Diethyleneglycol diacrylate | | 20 | | | | |
| B | Hydroxyl group-containing ester compound of Synthesis Example 1 | 41 | 41 | 41 | 28 | 22 | 41 |
| C | Desmodur N3300 (Note 1) | 59 | 59 | | 59 | | 59 |
| | Blocked isocyanate compound (Note 2) | | | 87 | | | |
| | OH/NCO molar ratio | 1 | 1 | 1 | 1 | | 1 |
| | Cymel 325 (Note 3) | | | | | 30 | |
| D | LUCIRIN TPO (Note 4) | 2 | 2 | 2 | 2 | 2 | 0 |
| | Hydroxyl group-containing acrylic resin of Synthesis Example 2 | | | | | 48 | |
| | Lactone-modified polyol of Synthesis Example 3 | | | | 9.9 | | |
| | Scat 24 (Note 5) | 0.05 | 0.05 | 0.05 | 0.05 | 0 | 0.05 |
| | Setalux C-7176VB-60 (Note 6) | 2 | 2 | 2 | 2 | 2 | 2 |
| | Solids content at the time of application | 87 | 90 | 75 | 84 | 70 | 85 |
| Test Result | Appearance (Sagging resistance) | ○ | ○ | ○ | ○ | ○ | X |
| | Coatin film hardness | 10 | 9 | 10 | 10 | 9 | 8 |
| | Scuff resistance | ○ | ○ | ○ | ○ | ○ | ○ |
| | Acid resistance | ○ | ○ | ○ | ○ | ○ | ○ |

What is claimed is:

1. A high-solids coating composition which comprises:
   (A) a compound which has at least one radically polymerizable unsaturated group per molecule,
   (B) a hydroxyl group-containing ester compound which is obtained by ester-forming addition reaction between 2,2-dimethylolalkanoic acid of the following formula (I):

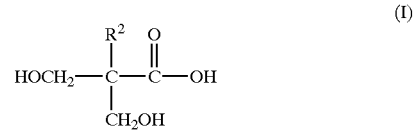

wherein $R^2$ is an alkyl group having 2 to 4 carbon atoms, and alkanoic acid monoglycidylester of the following formula (II):

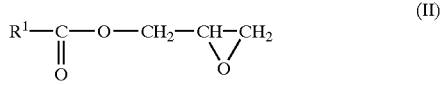

wherein $R^1$ is an alkyl group having 4 to 20 carbon atoms, and which has an acid value of 20 mgKOH/g or less, (C) a curing agent which is reactive with the above-mentioned hydroxyl group-containing ester compound (B), and (D) a photopolymerization initiator.

2. The composition of claim 1 wherein compound (A) is selected from the group consisting of adduct of hydroxyethyl (meth)acrylate with ε-caprolactone, acryloylmorpholine, paracumylphenol-ethyleneoxide-modified acrylate (trademark: Aronix M110), bisphenol A ethyleneoxide-modified di(meth)acrylate, bisphenol A propyleneoxide-modified di(meth)acrylate, trimethylolpropane tri(meth)acrylate and pentaerythritol tri(meth)acrylate.

3. The composition of claim 1 wherein 2,2-dimethylolalkanoic acid of formula (I) is 2,2-dimethylolbutanoic acid.

4. The composition of claim 1 wherein $R^1$ formula (II) is a branched alkyl group having 4 to 13 carbon atoms.

5. The composition of claim 1 wherein alkanoic acid monoglycidylester of formula (II) is selected from the group consisting of pivalic acid glycidylester, cyclohexanoic acid glycidylester, 2-ethylhexanoic acid glycidylester, isononanoic acid glycidylester, decanoic acid glycidylester, Cardura E10, Glydexx N10 and Araldite PT910.

6. The composition of claim 1 wherein the acid value of the hydroxyl group-containing ester compound (B) is 10 mgKOH/g or less.

7. The composition of claim 1 wherein the hydroxyl group-containing ester compound (B) has a hydroxyl value in a range of 300 to 550 mgKOH/g.

8. The composition of claim 1 wherein the hydroxyl group-containing ester compound (B) is a compound of the following formula (III) and/or (IV):

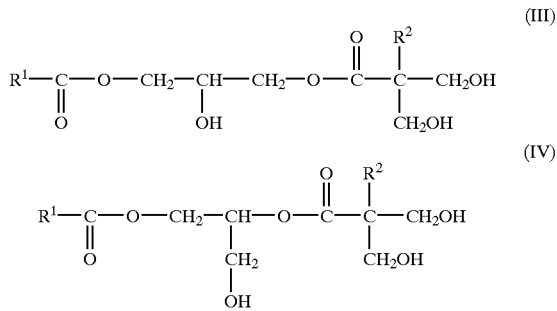

wherein $R^1$ and $R^2$ have the meanings as defined in claim 1.

9. The composition of claim 1 wherein curing agent (C) is polyisocyanate compound or amino resin.

10. The composition of claim 1 wherein curing agent (C) is a non-blocked polyisocyanate compound.

11. The composition of claim 1 wherein photopolymerization initiator (D) is selected from the group consisting of benzoin, benzoin methyl ether, benzoin ethyl ether, benzoin isobutyl ether, diethoxy acetophenone, 2-hydroxy-2-methyl-1-phenylpropan-1-one, benzylmethyl ketal, 1-hydroxycyclohexyl-phenylketone, 2-methyl-2-morpholino(4-thiomethyl-phenyl)propan-1-one, 2-benzyl-2-dimethylamino-1-(4-morpholinophenyl)butanone, 2,4,6-trimethylbenzoylphenylphosphine oxide, 2,4,6-trimethylbenzoylphenylethoxyphosphine oxide, benzophenone, methyl o-benzoylbenzoate, hydroxybenzophenone, 2-isopropylthioxanthone, 2,4-dimethylthioxanthone, 2,4-diethylthioxanthone, 2,4-dichlorothioxanthone, 2,4,6-tris(trichloromethyl)-S-triazine, 2-methyl-4,6-bis(trichloro)-S-triazine and 2-(4-methoxyphenyl)-4,6-bis(trichloromethyl)-S-triazine.

12. The composition of claim 1 which contains compound (A) in an amount within a range of 1 to 200 parts by weight per 100 parts by weight of the total of hydroxyl group-containing ester compound (B) and curing agent (C).

13. The composition of claim 1 which contains hydroxyl group-containing ester compound (B) and curing agent (C), the weight ratio of solid content of hydroxyl group-containing ester compound (B)/solid content of curing agent (C) being within a range of 90/10 to 50/50.

14. The composition of claim 1 wherein curing agent (C) is a polyisocyanate compound, and wherein equivalent ratio of NCO group in said polyisocyanate compound/OH group in hydroxyl group-containing ester compound (B) is within a range of 0.5/1 to 2.0/1.

15. The composition of claim 1 which contains photopolymerization initiator (D) in an amount within a range of 0.1 to 40 parts by weight per 100 parts by weight of compound (A).

16. The composition of claim 1 wherein solid content in the coating composition which has a viscosity of 60 seconds by Ford cup # 4 at 20° C. accounts for at least 60% by weight.

17. A process to form a cured coating film by spray coating of the coating composition of claim 1, which process is characterized by irradiating flying paint particles which have been sprayed and/or paint which has been applied onto a substrate with active energy ray so as to make the coating composition partially react, and by subsequently heating the coating composition.

18. A method for the formation of multi-layer coating film which is composed of at least one layer of colored coating film and at least one layer of clear coating film, and in which the uppermost layer is a clear coating film, which method is characterized by the formation of the uppermost clear coating film by means of the above-mentioned process of claim 17 to form a cured coating film, which is the said uppermost clear coating film.

19. Articles which have been coated with the coating composition of claim 1.

* * * * *